(12) United States Patent
Johnstone

(10) Patent No.: US 7,366,049 B2
(45) Date of Patent: Apr. 29, 2008

(54) APPARATUS AND METHOD FOR UPDATING DATA IN A DUAL PORT MEMORY

(75) Inventor: Colin Johnstone, Fife (GB)

(73) Assignee: Agilent Technologies, Inc., Palo Alto, CA (US)

( * ) Notice: Subject to any disclaimer, the term of this patent is extended or adjusted under 35 U.S.C. 154(b) by 2 days.

(21) Appl. No.: 11/418,552

(22) Filed: May 4, 2006

(65) Prior Publication Data

US 2006/0256641 A1 Nov. 16, 2006

(30) Foreign Application Priority Data

May 13, 2005 (GB) .................................. 0509856.1

(51) Int. Cl.
*G11C 8/00* (2006.01)
*G11C 7/06* (2006.01)

(52) U.S. Cl. ........................... 365/230.05; 365/189.07; 365/233

(58) Field of Classification Search ........... 365/230.05, 365/233, 189.07
See application file for complete search history.

(56) References Cited

U.S. PATENT DOCUMENTS

| | | | |
|---|---|---|---|
| 5,233,545 A * | 8/1993 | Ho et al. ..................... | 702/180 |
| 5,436,863 A * | 7/1995 | Kogure .................. | 365/189.04 |
| 5,444,658 A * | 8/1995 | Izawa et al. ........... | 365/189.07 |
| 5,465,344 A | 11/1995 | Hirai | |
| 5,781,480 A | 7/1998 | Nogle et al. | |
| 5,956,748 A | 9/1999 | New | |

(Continued)

FOREIGN PATENT DOCUMENTS

EP 0418499 A2 3/1991

(Continued)

*Primary Examiner*—Lý Duy Pham
(74) *Attorney, Agent, or Firm*—Marc Bobys

(57) ABSTRACT

A dual port memory is updated at substantially the same data sampling rate as a clock frequency of the dual port memory. The dual port memory stores data relating to each different parameter value in a stream of data samples, and provides the stored data from an address in the memory corresponding to the received parameter value. An updating element updates stored data and provides the updated data to an input of the dual port memory for writing back into the address corresponding to the received parameter value. A first port of the dual port memory is utilised as the output of the dual port memory coupled to the input of the updating element on a first clock cycle of the dual port memory, and a second port of the dual port memory is normally utilised as the input of the dual port memory coupled to the output of the updating element on a second clock cycle, the next address being accessed via the first port on the second clock cycle. A comparator receives the parameter value on the first clock cycle of the dual port memory and a next received parameter value on a second clock cycle, and provides a match signal if the received parameter value and the next received parameter value are the same. The match signal is utilised to enable the first port of the dual port memory to be used as the input for the second clock cycle so that the data updated by the updating element on the first clock cycle is provided at the first port rather than the second port and is therefore correctly provided to the input of the updating element on the second clock cycle.

18 Claims, 4 Drawing Sheets

U.S. PATENT DOCUMENTS 5,973,955 A 10/1999 Nogle et al.
6,000,016 A * 12/1999 Curtis et al. ................ 711/138
6,181,634 B1 1/2001 Okita
6,310,818 B1 10/2001 Mukai
7,019,506 B2 * 3/2006 Kernahan ................... 323/284
7,277,820 B2 * 10/2007 Johnstone et al. .......... 702/180
2006/0256641 A1 * 11/2006 Johnstone .............. 365/230.05
2006/0259257 A1 * 11/2006 Johnstone et al. ............ 702/78

FOREIGN PATENT DOCUMENTS

EP 1722306 A 11/2006
GB 2361340 A * 10/2001

* cited by examiner

APPARATUS AND METHOD FOR UPDATING DATA IN A DUAL PORT MEMORY

PRIORITY CLAIM

Foreign priority rights under Title 35, United States Code Section 119, to Great Britain Application Number 0509856.1, filed May 13, 2005, are hereby claimed.

This invention relates to an apparatus and method for updating data in a dual port memory at substantially the same rate as a clock frequency of the dual port memory, especially, though not exclusively, to updating such data to produce frequency counts of occurrences of input signal values to enable Complementary Cumulative Distribution Function (CCDF) curves for signal power to be produced, for example in Radio Frequency applications.

BACKGROUND ART

A power CCDF curve is frequently used in RF applications to provide critical information about the signals encountered in RF systems, for example in modern $3^{rd}$ Generation (3G) digitally modulated radio systems. The power CCDF curve consists of a curve relating the percentage of time a radio signal spends at or above a particular power level. It is usually shown as a graph of the ratio of the instantaneous power to the average power against percentage of time that the signal power is at, or above, the power specified in the X axis. Both axes of the graph are usually logarithmic.

Perhaps the most important application of power CCDF curves is to specify completely the power characteristics of the signals that will be mixed, amplified and decoded in communication systems. For example, 3G systems combine multiple channels resulting in a peak-to-average power ratio that is dependent upon not only the number of channels, but also which specific channels are used. This signal characteristic can lead to higher distortion unless the peak power levels are accounted for in the design of system components, such as amplifiers and mixers.

A typical system can take around 5 seconds to measure and process 100,000 samples. In most known systems, samples tend to be captured at high speed for a short time, then the captured samples are processed and then another batch of samples are taken. Current ADC technologies are capable of running at speeds in the range of 10M samples/second up to, in some cases, several Giga samples per second. What this means is that a typical system will take very short snapshots of a waveform, which can result in missing the elusive high peak levels that have the greatest effect on the resulting measurement numbers.

As well as examining a graph, a user may also request the power level at which a certain percentage of the measurements lie in excess. Typical percentages lie in the range of 0.01% to 0.0001%. For example, if a sample of 100,000 measurements has taken place, if the user requires the power ratio at which 0.01% of samples lie in excess then there will be 10 samples lying above the 0.01% percentage point (0.01%=1/10,000). Normally the ratio of the tenth largest sample to the calculated average power is returned.

It can also be readily seen that 100,000 samples provides only ten samples "above the line" for a 0.01% measurement. Measurements of 0.001% or 0.0001% would require orders of magnitude more time to get the same accuracy. Furthermore, ten samples is, in some circumstances, not a sufficiently large number on which to base an accurate measurement.

A dual port memory is a memory that has two address buses and at least two data buses, one address bus and at least one data bus forming one port. The memory can be accesses at both ports at once provided the addresses are not the same. If the addresses are the same, then if either port is writing to the memory, the result is indeterminate. An updating device, such as an adder, coupled to one port of the dual port memory can update the count value and provide it in the same clock cycle, so that the updated count value is ready to be written on the next clock cycle at either port. Thus, since a particular address in the memory is read in one clock cycle and written in the next clock cycle, it takes half the frequency of the clock cycle to perform an update of a sample into the memory.

DISCLOSURE OF INVENTION

The present invention therefore seeks to provide a method and apparatus for updating data in a dual port memory at substantially the same rate as a clock frequency of the dual port memory, which overcomes, or at least mitigates, the above-mentioned problems of the prior art.

Accordingly, in one aspect, the invention provides an apparatus for updating data relating to an input signal in a dual port memory at substantially the same data sampling rate as a clock frequency of the dual port memory, the apparatus comprising an Analog to Digital Converter (ADC) having an input for receiving the input signal and an output, the ADC sampling the input signal at sampling points to provide a parameter value corresponding to a desired parameter of the input signal at each sampled point at the output, a dual port memory for storing data relating to each received parameter value, the memory having an input for receiving each parameter value and an output for providing the stored data from an address in the memory corresponding to the received parameter value, an updating element having an input coupled to the output of the memory for receiving the stored data, for updating that stored data and for providing the updated data at an output coupled to an input of the dual port memory for writing back into the address corresponding to the received parameter value, a first port of the dual port memory being utilised as the output of the dual port memory coupled to the input of the updating element on a first clock cycle of the dual port memory and a second port of the dual port memory being normally utilised as the input of the dual port memory coupled to the output of the updating element on a second clock cycle, and a comparator having a first input coupled to the output of the ADC for receiving the parameter value on the first clock cycle of the dual port memory and a second input for receiving a next received parameter value on a second clock cycle and an output for providing a match signal if the received parameter value and the next received parameter value are the same, the output of the comparator being coupled to the dual port memory and the match signal being utilised to enable the first port of the dual port memory to be used as the input for the second clock cycle so that the data updated by the updating element on the first clock cycle is provided at the first port rather than the second port and is therefore correctly provided to the input of the updating element on the second clock cycle.

The dual port memory may comprise a single bank, which is utilised for a first predetermined period of time for storing the updated data and is utilised for a second predetermined period of time for reading the updated data stored therein in a previous first predetermined period.

The apparatus may further comprise a further memory for storing the updated data read from the dual port memory during the second predetermined period of time. When data is read from the dual port memory during the second predetermined period of time, the data may be set to zero.

The data stored in the dual port memory may comprise a frequency count of occurrences of each received parameter value and the updating element may comprise an adder for incrementing the stored frequency count every time the parameter value corresponding to that frequency count is received.

The apparatus may comprise a plurality of dual port memories each having an adder associated therewith, the memories being used to store frequency counts of occurrences of received parameter values in differing ranges of parameter values.

The apparatus may comprise a multiplexer having an input coupled to the output of the ADC for receiving the parameter value and a plurality of outputs, each output being coupled to one of the plurality of memories, the multiplexer passing the received parameter value to one of the outputs based on the range of parameter values within which the received parameter value falls.

The memories may accept shorter bit length data words than the bit length of data words received from the ADC, and the multiplexer may pass a reduced length of each parameter value data word received from the ADC to one of the plurality of outputs based on the most significant data bits that are present in the parameter value data word received from the ADC.

In a second aspect, the invention provides a method for updating data relating to an input signal in a dual port memory at substantially the same data sampling rate as a clock frequency of the dual port memory, the method comprising sampling the input signal at sampling points to provide a parameter value corresponding to a desired parameter of the input signal at each sampled point at the output, storing data relating to each received parameter value in a dual port memory, the memory having an input for receiving each parameter value and an output for providing the stored data from an address in the memory corresponding to the received parameter value, updating the stored data, a first port of the dual port memory being utilised as the output of the dual port memory on a first clock cycle of the dual port memory and a second port of the dual port memory being normally utilised as the input of the dual port memory on a second clock cycle, and comparing a parameter value on the first clock cycle of the dual port memory with a next received parameter value on a second clock cycle to provide a match signal if the received parameter value and the next received parameter value are the same, the match signal being utilised to enable the first port of the dual port memory to be used as the input for the second clock cycle so that the data updated on the first clock cycle is provided at the first port rather than the second port and is therefore correctly provided at the output of the dual port memory on the second clock cycle.

A single bank of the dual port memory may be utilised for a first predetermined period of time for storing the updated data and may be utilised for a second predetermined period of time for reading the updated data stored therein in a previous first predetermined period.

The method may further comprise storing the updated data read from the dual port memory during the second predetermined period of time into a further memory.

When data is read from the dual port memory during the second predetermined period of time, the data may be set to zero.

The data stored in the dual port memory may comprise a frequency count of occurrences of each received parameter value and the stored frequency count is incremented every time the parameter value corresponding to that frequency count is received.

The desired parameter may be power and the input signal may be a Radio Frequency (RF) signal, or the power envelop thereof.

BRIEF DESCRIPTION OF DRAWINGS

One embodiment of a method and apparatus in accordance with this invention, for updating data in a dual port memory at substantially the same rate as a clock frequency of the dual port memory, will now be described, by way of example, with reference to the accompanying drawings, in which.

DETAILED DESCRIPTION

Figure 1:
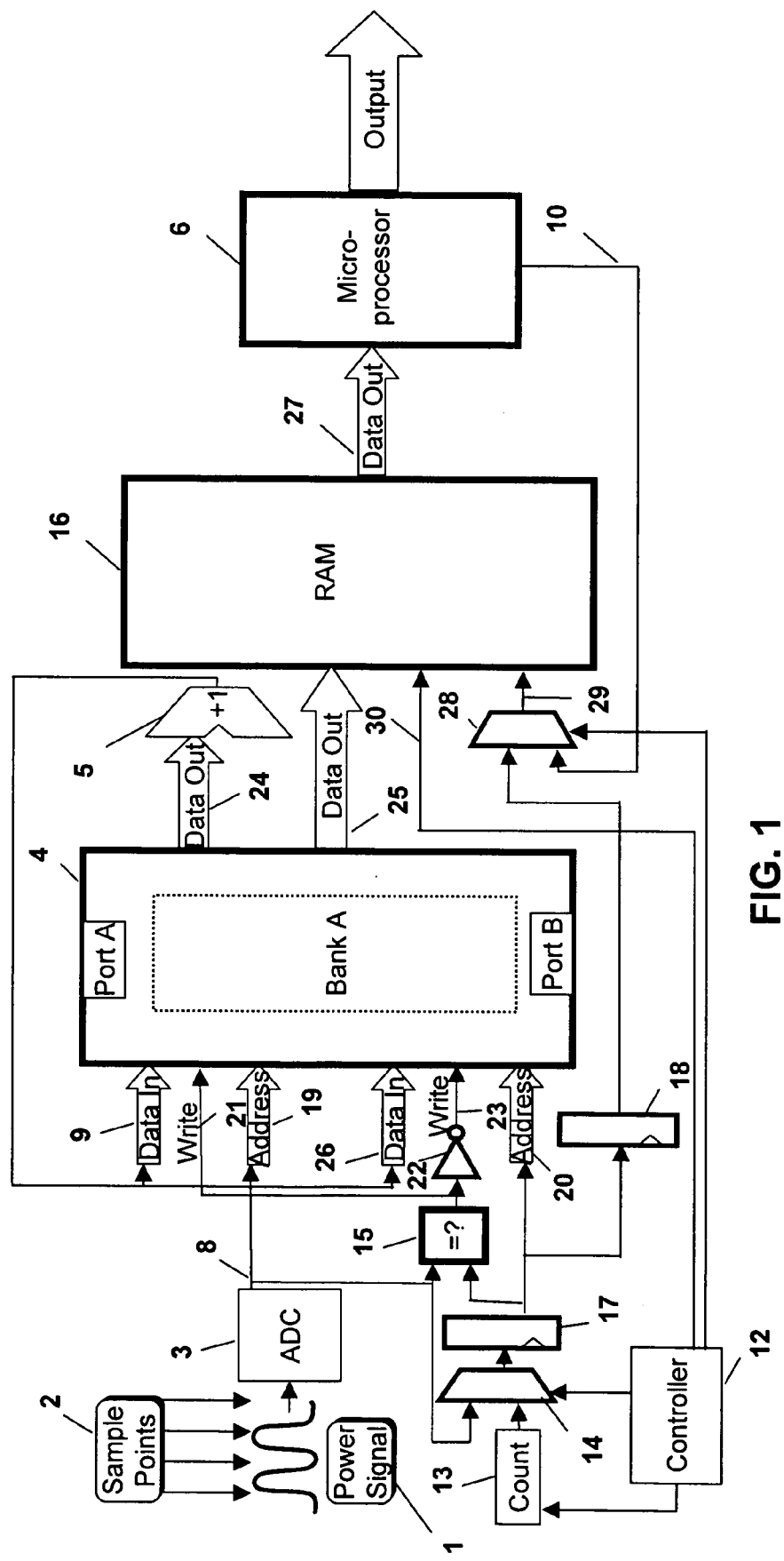
FIG. 1 shows a schematic block diagram of a basic circuit according to a first embodiment of the present invention.

As shown in FIG. 1, the basic circuit is used to digitise the input RF signal 1 by sampling it at sample points 2 using an Analogue to Digital Converter (ADC) 3. The ADC 3 has an output 8, provides a digital word of which the top n bits are used as an address presented at an address input 19 of Port A of dual port memory 4. Each sample causes the count stored in the memory at that address to be read out from the memory 4 and presented at a data output 24 of Port A to an adder 5. The adder 5 increments the count by one and provides the incremented count back to a data input of the memory 4 to be written back into the memory at the same address. The count data thus provides a frequency value of the frequency of occurrence of particular parameter values of the input signal. If the parameter is power, the memory 4 provides, effectively, a continuously updated histogram of the power values for the RF input signal. These can then be read by a CCDF curve generator 6 to generate the CCDF curve quickly and efficiently in a known manner. In order to remove the overhead for the CCDF curve generator of keeping a running accumulation of the frequencies at each read point relative to the previous read point, when the CCDF curve generator 6 reads the count values, they are replaced by zero. The CCDF curve generator is therefore presented with the actual frequencies per period and not a long term accumulation from which the frequencies pertaining to the current read period have to be derived.

In this embodiment, in order to allow the data to be read out to the CCDF curve generator 6, the capture is halted for a short period of time periodically to allow the memory to be read out using Port B. The apparatus includes a controller 12 which is used to control a counter 13 for presenting a count value to a first multiplexer 14. The controller 12 sets the counter to count down from one of two possible counts so as to have, effectively, two different time periods. During a first, longer, time period, the apparatus is used in "data capture" mode to capture the required data to the memory 4 and in the second, shorter, time period, the apparatus is used in "read" mode to read the contents of the memory 4 out to a second memory 16.

Thus, the output 8 of the ADC 3 (comprising the address in the memory to be written to) is coupled to the address input 19 of Port A of the memory 4. The output 8 of the ADC 3 is also coupled to the first multiplexer 14 and to a first input of a comparator 15. The first multiplexer 14 is controlled by the controller 12 to present the address from the ADC 3 at its output if the count value from the counter 13 indicates that the apparatus is in the "data capture" mode. The output of the first multiplexer 14 is passed to a first latch 17, which delays the address by one clock cycle. The address is then presented to a second input of the comparator 15, as well as to a second latch 18 and to the address input 20 of Port B of the memory 4.

If the apparatus is in the "read" mode, then the controller 12 controls the multiplexer 14 to pass the count value from the counter 13 to its output. This count value is used as the address at the address input 20 of Port B of the memory 4 and the contents of that address in the memory is read out at data output 25 to the second memory 16. Clearly, therefore, as the counter 13 cycles through all the count values, each address is read out to the second memory 16 and when the counter 13 times out, all the addresses have been read and the counter is again initialised by the controller to count the time period for the "data capture" mode. If desired, as the addresses are read out to the second memory 16, the data can be set to zero, as described above with reference to the first embodiment.

As long as the apparatus is in the "data capture" mode, the comparator 15 receives the address from the ADC at its first input and the address from the ADC from the previous clock cycle, which has been passed via the multiplexer 14 and delayed in the latch 17, at its second input. Thus, the comparator compares the address at one clock cycle with the address from the previous clock cycle. The output of the comparator 15 is a match signal indicating if the two addresses are the same or not. If they are not the same, then the output from the comparator is passed to the Write input 21 of Port A of memory 4 to disable Port A from writing. This allows the address on that clock cycle presented directly at the address input 19 of Port A to be used to access that address in the memory and present the contents thereof at the data output 24 to the adder 5. At the same time, the output of the comparator is presented, via inverter 22, to the Write input 23 of Port B of memory 4 to enable Port B to write the data at data input 26 to the address provided at the address input 20. The data at the data input 26 is, of course, the incremented frequency count from adder 5.

Conversely, if the comparator finds that the two addresses are the same, then the output signal from the comparator is used to disable the Write input 23 of Port B of memory 4 and to enable the Write input 21 of Port A of memory 4 so the incremented frequency count from adder 5 at the data input 9 of Port A is used as the data to be written into the appropriate address and presented at the data output 24 to the adder 5. In this embodiment, the memory is capable of presenting, on the read port, the data written on the same cycle to the same location to the write port. This can only be achieved if the write and read are performed to the same port; if this were attempted using both ports, the result would be indeterminate.

When the frequency count data for each power value has been read from the memory 4 during the "read" mode, into the second memory 16, the CCDF curve generator 6 can then read the frequency count data from the second memory 16, via data output 27 of the second memory 16, in the manner described above with reference to FIG. 1. In this case, the addresses to be read, taken from output 10 from the CCDF curve generator 6, are passed to one input of a second multiplexer 28, which is controlled by the controller 12, the second input of the multiplexer being coupled to an output of the second latch 18. The output of the second multiplexer 28 is coupled to an address input 29 of the second memory 16. The controller 12 also provides a signal to a Write input 30 of the second memory 16. Thus, the second memory 16 is enabled to write the data during the "read" mode when the data is being read from the memory 4 into the second memory 16. During this mode, the count values from counter 13, which are being used as the addresses to read memory 4, are then passed via second latch 18 to delay them by one clock cycle to the second multiplexer 28, which is controlled to pass them on to the address input of the second memory 16 so that the data read from that address in the memory 4 is then written on the next clock cycle into that address in the second memory 16. During the "data capture" mode, the controller 12 disables the Write input 30 of the second memory 16 and controls the second multiplexer 28 to pass the addresses to be read from the output 10 of the CCDF curve generator 6 to the address input 29 of the second memory 16. The addresses are therefore read and provided at the data output 27 of the second memory 16 to be processed by the CCDF curve generator 6.

In this way, the circuit can be speeded up to 100 MHz capture speed provided that the circuitry is stopped for a short time in order to read data out. When stopped one port can be used to initialise and read out the memory. Also since the memory is stopped to read, there is no need for ping-pong buffers thus doubling the effective memory size. For a memory having a size 512×36, this gives one bank of 512 (i.e. 9 bits). The accumulator would overflow after $2^{36}$ samples are received. (~11.5 minutes at 100 MHz) with 32 bit words providing an absolute minimum of 42 seconds capture before an overflow is possible. Thus, the circuit could stay in "data capture" mode for at least 42 seconds capturing $2^{32}$ samples, and then switch to "read" mode for 512 microseconds.

Figure 2:
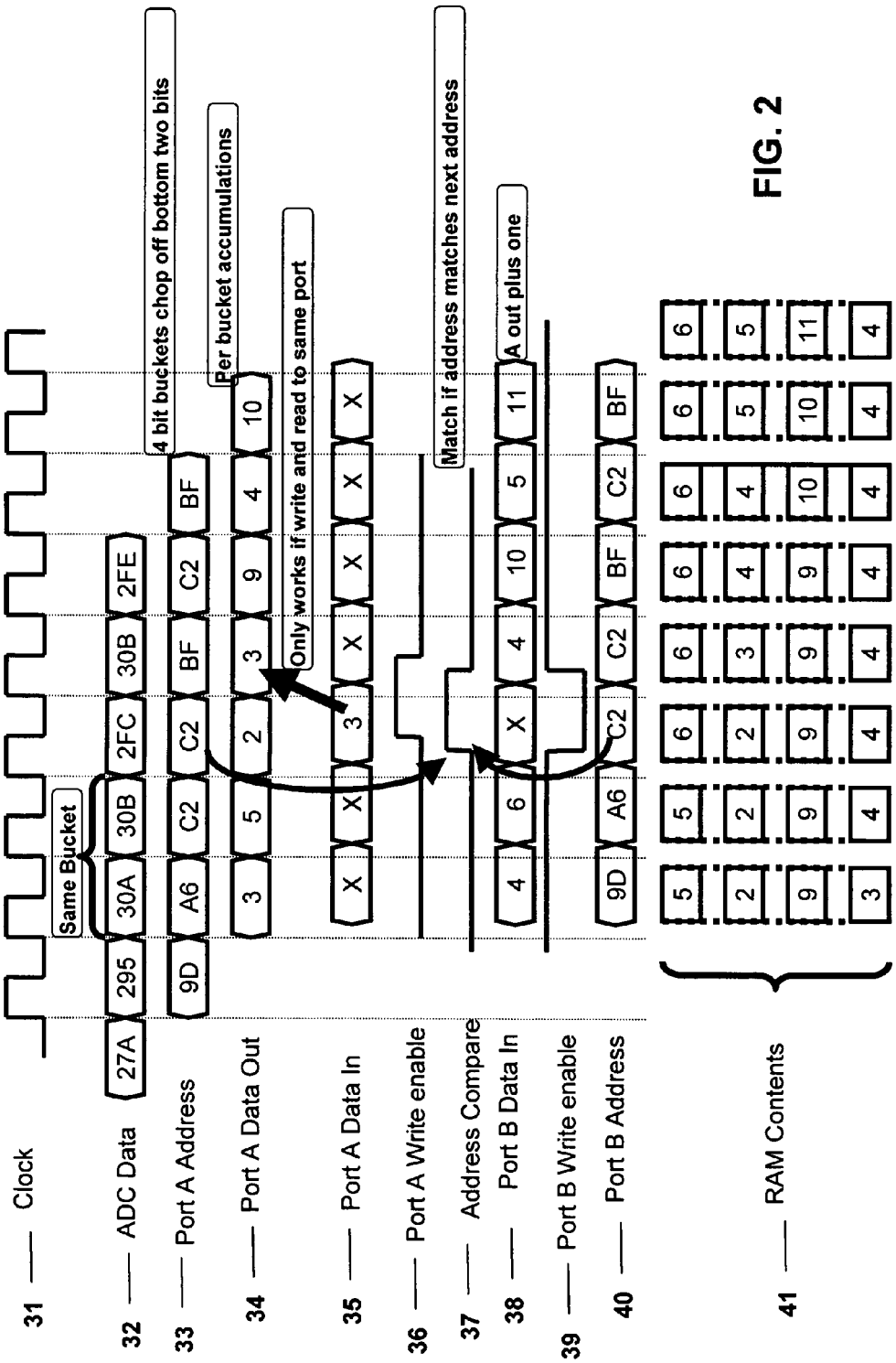
FIG. 2 shows a timing diagram for the circuit of FIG. 1.

FIG. 2 shows a timing diagram for the circuit described above with reference to FIG. 1. The first line shows the clock signal 31 running at 100 MHz. The next signal shown is the ADC Data line 32 showing a number of different power values in hexadecimal format. In the example shown, for a simplified version, the two least significant bits are ignored for 4 bit buckets (ranges) so that, as looked at from the left, the fifth and seventh power values should be put in the same bucket with the same address, as should the third, fourth and sixth power values. The address for each power value is provided on the next clock cycle on the Port A Address line 33, which, of course, shows that the third and forth addresses (from the left) are the same. The Port A Data Out line 34 indicates the frequency count for the particular address (i.e. the number of occurrences that it has previously sampled) previously stored in the memory. The updated frequency count is then provided in the Port B Data In line 38 to be written into the same address, shown on Port B Address line 40, on the next clock cycle.

In this example, the third frequency count on the Port A Data Out line is originally 2 so that the fourth frequency count, being to the same address, should be written in as 4 (since it was 2 and then two consecutive samples of this power value occurred). However, as explained above, this would only occur properly if the memory operates by reading and writing to the same port. If, as in this embodiment, the read and write are normally carried out on different ports, then the circuit needs to disable the usual write port and enable the usual read port to write so that the correct data is accumulated. As can be seen on the Address Compare signal line 37, when the second consecutive address is found to be the same (by the comparator 15), the Address Compare line 37 is enabled for one clock cycle. This causes the Port A Write enable line 36 to be enabled and the Port B Write enable line 39 (which is usually enabled) to be disabled. Furthermore, the Port B Data In signal for that clock cycle is a don't-care, whereas the Port A Data In signal includes the correct incremented data (count of 3) from the adder, as explained above. This means that the data from the Port A Data In line is immediately read onto the Port A Data Out line on the next clock cycle so that it can then be properly incremented and provided on to the Port B Data In line (as a count of 4) on the subsequent clock cycle. It should be noted that since the address required to perform the read and write is identical, there is no need for extra address processing circuitry on the port A address. The actual RAM Contents 41 of the four different RAM addresses is also shown for each of the clock cycles.

Figure 3:
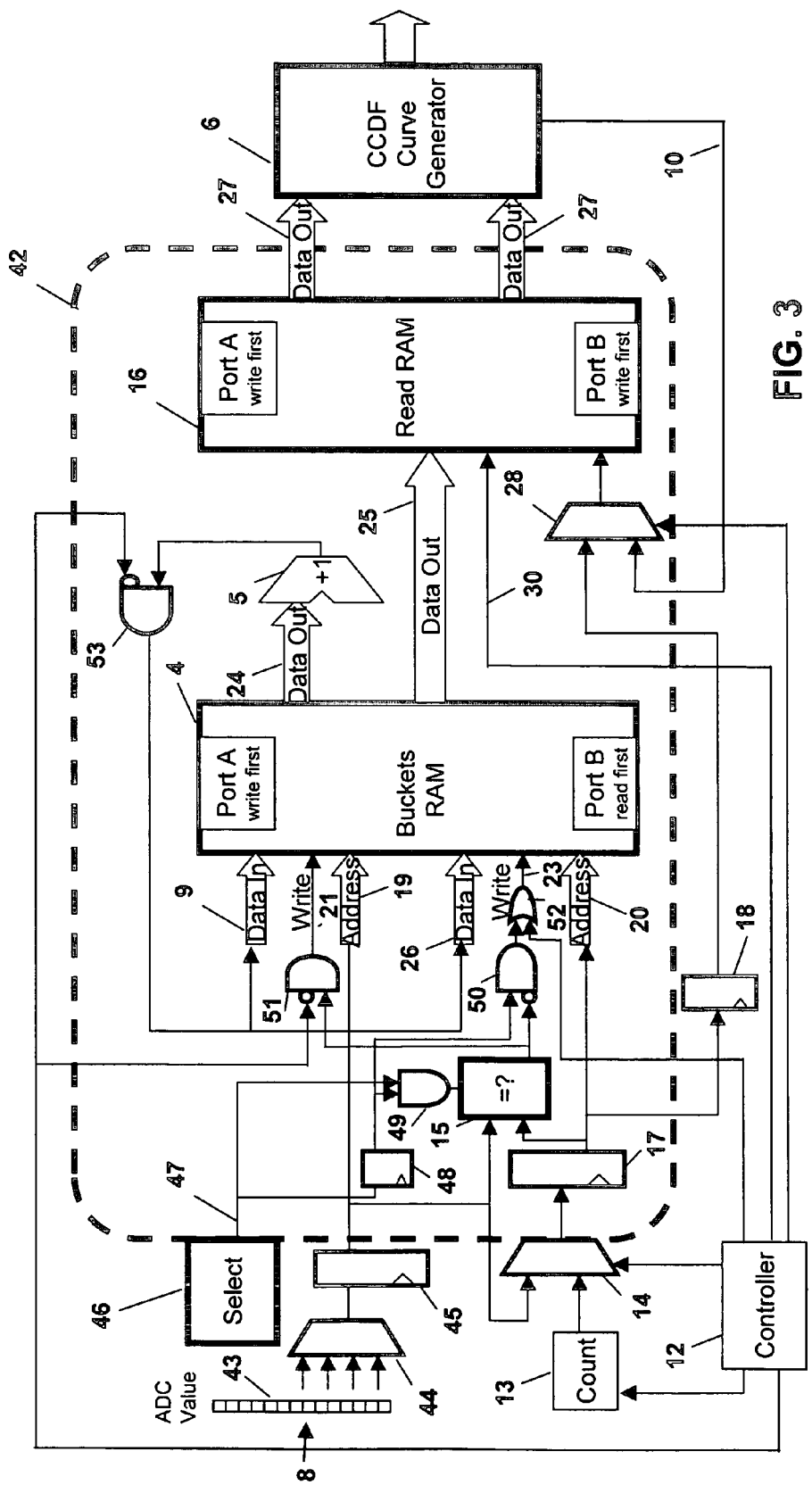
FIG. 3 shows a schematic block diagram of a circuit according to a second embodiment of the present invention.

FIG. 3 shows a second embodiment of the present invention, where the same elements as in the previous embodiment are designated with the same numerals for ease of reference. In this case, as can be seen, the memory 4, the second memory 16, and some of the circuit elements including the first latch 17 and the comparator 15, form a histogram capturing block 42. In this embodiment, a data word 43 from the ADC output 8 is passed to a third multiplexer 44, which is used to pass a selected number of bits of the data word through to a third latch 45. The output of this third latch 45 provides the address passed to the address input 19 of Port A of the memory 4, as well as to the first multiplexer 14 and to the first input of comparator 15, as in the previous embodiment.

Figure 4:
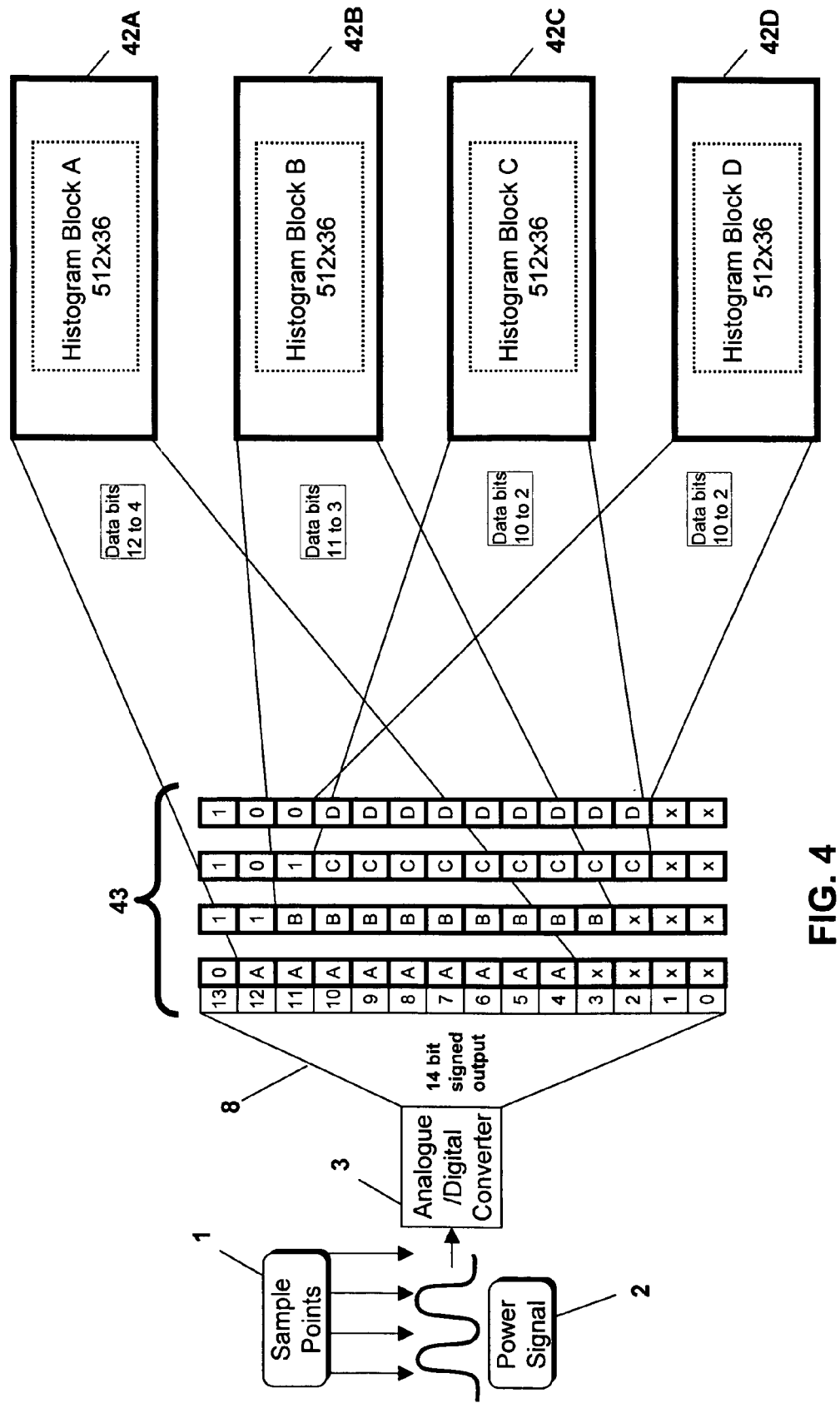
FIG. 4 shows a schematic diagram of the operation of the circuit of FIG. 3 in an expanded version.

In this embodiment, the apparatus includes a plurality of similar histogram capturing blocks 42, each having the same inputs and outputs as the one shown in FIG. 4. Each histogram capturing block 42 is used to capture data in different ranges of values. It will be appreciated that a CCDF curve is usually logarithmic, so that in order to have adequate data resolution at different ranges, different ranges of the bits of the ADC word 43 should be used. For example, if only the 8 most significant bits of a 14 bit data word were to be used, then any differences in the lowest values would be lost, even though they may provide a lot of information on a logarithmic scale. Thus, in order to preserve the information, a plurality of histogram capturing blocks 42, each being used for a different value range of the power values, is provided. The number of histogram blocks can be selected according to the number of ranges of accuracy that may be required. For example, for a logarithmic scale having four decades of values, there may be five histogram capturing blocks provided: one for each decade plus one for the lowest values down to zero, as these values are necessary in order to produce an accurate figure for the average power.

FIG. 4 shows schematically how a 14 bit data word generated by the ADC 3 from a sample of the input signal 1, may be passed to any one of, in this case, four, 9 bit histogram capturing blocks 42A-D. As shown, bit 13 of the data word 43 indicates whether the power value is high or low. If it is a "0", as shown, it is a high-gain power value so that the next 9 bits (i.e. bits 12 to 4) are used as the address passed to high value histogram capturing block 42A. If bit 13 is a "1", then the next bit, bit 12 is looked at to determine which histogram capturing block is to be used. If bit 12 is a "1", then histogram capturing block 42B is used and the next 9 bits (bits 11 to 3) are passed as the address to histogram capturing block 42B. If bit 12 is a "0", then the next bit, bit 11 is looked at to determine which histogram capturing block is to be used. If bit 11 is a "1", then histogram capturing block 42C is used and the next 9 bits (bits 10 to 2) are passed as the address to histogram capturing block 42C. If bit 11 is a "0", then, in this case, this is the lowest range available, so that again, bits 10 to 2 are used and passed as the address to histogram capturing block 42D where the lowest values closest to zero are accumulated.

Thus, the top bits of every incoming data word are checked and depending upon their value, a set of 9 incoming bits is sent to one of the four histogram blocks. Each histogram block contains 512 scaled bins. There are more milli-watts per bin in block A compared with block D. The minimum "step size" in each histogram block (except D which is a special case) was targeted to be 0.02 dB. The lowest power range histogram has to go down to a value of zero so that a relatively accurate average value can be obtained for the purposes of drawing the CCDF curve. The number of bits covered can be extended by adding one histogram block per bit. The reason this can be done is that the CCDF curve is displayed in dB. A range of 0.02 dB at 10 mW is a much larger value than at 0.1 mW. To maintain an accuracy per bin of 0.02 dB requires less bits at lower powers. Thus a wider set of values (in this example $2^{12}$ (4096)) can be accurately used for a CCDF curve with only 2048 memory locations used, This improvement gets better when more bits are covered, A $2^{14}$ (16384) set of values can be covered with only 3072 memory locations in 6 histogram blocks.

Turning back to FIG. 3, a select controller 46 is used to select which histogram capturing block 42 is to be used for any particular power value data word 43 arriving from the ADC. The select controller 46 reads the most significant bits that are used in the data word 43, as described above, and generates an enable signal which is provided at an output 47 of the select controller 46 and is passed to the particular histogram capturing block 42 which is to capture the particular power value, and passes a disable signal to all the other histogram capturing blocks. Thus, as shown in FIG. 3, the signal from the output 47 of the select controller 46 is passed to a fourth latch 48 and to one input of a first AND gate 49. The output of the fourth latch 48 is passed to a second input of the first AND gate 49 and to one input of a second AND gate 50, whose other input is an inverted output from the comparator 15. Thus, if the select controller provides an enable signal for two consecutive clock cycles, the first AND gate 49 will generate an enable signal which is used to enable the comparator 15. The output of the comparator 15 is then passed to a third AND gate 51, and, inverted, to the second AND gate 50. The output of the second AND gate 50 is coupled to one input of an OR gate 52, whose output is coupled to the Write input of the memory 4. The other input of the OR gate 52 is coupled to receive a control signal from the controller 12.

Thus, if the select controller 46 selects this histogram capture block 42, and the output from the comparator 15 indicates that the addresses on consecutive clock cycles are the not the same, the output from the second AND gate 50 will be high (because the output from the comparator is inverted at the input to the second AND gate) and the output from the OR gate 52 will therefore be high. If, on the other hand, the output from the comparator 15 indicates that the addresses on consecutive clock cycles are the same, the output from the second AND gate 50 will be low and the output from the OR gate 52 will thus be low to disable the Write input of the memory 4. The controller output to OR gate 52 is the "read" mode signal. In "read" mode, the WRITE signal on port B is forced high so that the data value (now forced to zero by AND gate set 53) is written to all locations as the data is read out to Read RAM block 16. Furthermore, if the signal from the output 47 of the select controller 46, via the fourth latch 48, is low, indicating that this histogram capturing block 42 is not selected, then the output from second AND gate 50 will be low, and the output from OR gate 52 will also be low, thereby disabling the Write input 23.

The controller 12 also generates a "read" signal which is passed to inverting inputs of the third AND gate 51 and of a fifth set of AND gates 53, whose other input is the output of the adder 5. Thus, when the output of the comparator 15 is high, indicating that the addresses are the same, and the "read" signal from the controller 12 is high, indicating that the apparatus is in the "read" mode of operation, the third AND gate 51 will have a low output (because the "read" signal is inverted) and the Write input 21 of the memory 4 will therefore be disabled. When the output of the comparator 15 is high, indicating that the addresses are the same, and the "read" signal from the controller 12 is low, indicating that the apparatus is in the "capture data" mode of operation, the third AND gate 51 will have a high output and the Write input 21 of the memory 4 will therefore be enabled. When the output from the comparator is low, indicating that the addresses are not the same, the output from the third AND gate 51 will be low, irrespective of the state of the "read" signal from the controller and the Write input 21 will always be disabled.

The output of the fifth set of AND gates 53 will only be enabled when the output of the adder 5 is high and the "read" signal is low (because the "read" signal is inverted at the input to the fifth AND gate 53), thus making sure that the output from the adder 5 is passed to the memory 4 during the "data capture" mode of operation and set to zero during the "read" mode.

It will thus be apparent that the above described embodiment can capture tens of millions of samples per second for the whole second without gaps. Indeed a circuit based on the described architecture could run for at least 42 seconds ($2^{32}$ identical samples in a row) capturing 4.2 Giga-samples without any gaps thus capturing elusive power spikes. Comparing this with currently available solutions, a small gap in the incoming data is acceptable. By reading all the data from the memory into another identically sized memory as fast as possible, the "dead time" between measurements could be as low as 2.56 μs for a 512 word memory read at 100 MHz. A one second measurement could take place followed by a 2.56 μs gap and then another 1 second measurement could take place. If the user wants 1 billion samples ($10^9$) he would have to wait for 10 seconds to get his gap-free measurement. (compared with up to 14 hours with current equipment).

In addition, the fact that the captured frequencies exist in a memory separate from that used to perform the histogram function means that the next sample set can be captured at the same time as the CCDF curve generator is generating a curve for the last captured set of data. This further reduces dead time between sampling compared with currently available solutions.

Returning to the 100,000 sample example mentioned earlier, using a hardware approach we can capture 100,000 samples in one millisecond. Alternatively by trading off sample time and number of samples, we can provide a much more accurate measurement in a fraction of the time taken with current methods. Typically the sample time would be set to 0.1 seconds or 1 second. In that time a 0.01% measurement would be based upon 10000 samples. Even the 0.0001% measurement would be more accurate in much less than 1 second. Indeed the speed of the circuit is so fast and accurate that it is not necessary to provide control of the number of samples except in exceptional circumstances.

A CCDF output graph typically needs a range of around 15 dB with a reasonable accuracy. Since the FPGA RAMs have 512 locations, this means that only nine data bits can be processed per RAM ($2^9$=512). In order to provide sufficient accuracy, a number of blocks are provided each examining a different set of data bits. Each range is chosen to give a certain accuracy in dB. In the above described case the circuit should have six histogram blocks to provide an accuracy of better than 0.02 dB.

Since the above described circuit can examine all of an incoming waveform, it can be modified to only sample between specific points in time. This means that a pulsed Radio signal could have its CCDF measured only during the pulses.

It will be appreciated that although only two exemplary embodiments of the invention have been described in detail, various modifications and improvements can be made by a person skilled in the art without departing from the scope of the invention.

For example, the selection of appropriate ranges for each address in the memory (i.e. the amplitude of values covered within by one address) could be either automatic or programmable. Although the second memory has been shown in FIG. 3 as a dual port memory, it will be appreciated that it need not be a dual port memory and that any suitable RAM could be used. Furthermore, it will be appreciated that the incrementation operation performed by the adder could be a different updating operation, which may be some type of cumulation, but need not be. Any updating operation that operates on the data read from the dual port memory and then passes it back to the memory for writing back into the same address on the next clock cycle can be speeded up to the memory clock speed as described above.

The invention claimed is:

1. An apparatus for updating data in a dual port memory at substantially a same data sampling rate as a clock frequency of the dual port memory, the apparatus comprising:
   a. an Analog to Digital Converter (ADC) having an input for receiving an input signal and an output, the ADC sampling an input signal at sampling points to provide a stream of data samples, each said data sample having a parameter value;
   b. the dual port memory for storing data relating to each different parameter value, the memory having at least one input for receiving each parameter value and an output for providing the stored data from an address in the memory corresponding to the received parameter value;
   c. an updating element having an input coupled to the output of the memory for receiving the stored data, for updating the stored data and for providing the updated data at an output coupled to the at least one input of the dual port memory for writing back into the address corresponding to the received parameter value, a first port of the dual port memory being utilised as the output of the dual port memory coupled to the input of the updating element on a first clock cycle of the dual port memory and a second port of the dual port memory being normally utilised as one of the at least one input of the dual port memory coupled to the output of the updating element on a second clock cycle, a next address being accessed via the first port on the second clock cycle; and d. a comparator having a first input coupled to the output of the ADC for receiving the parameter value on the first clock cycle of the dual port memory and a second input for receiving a next received parameter value on a second clock cycle and an output for providing a match signal if the received parameter value and the next received parameter value are the same, the output of the comparator being coupled to the dual port memory and the match signal being utilised to enable the first port of the dual port memory to be used as the input for the second clock cycle so that the data updated by the updating element on the first clock cycle is provided at the first port rather than the second port and is therefore correctly provided to the input of the updating element on the second clock cycle.

2. The apparatus according to claim 1, wherein the dual port memory comprises a single bank, which is utilised for a first predetermined period of time for storing the updated data and is utilised for a second predetermined period of time for reading the updated data stored therein in said previous first predetermined period.

3. The apparatus according to claim 2, further comprising a further memory for storing the updated data read from the dual port memory during the second predetermined period of time.

4. The apparatus according to claim 3, wherein when data is read from the dual port memory during the second predetermined period of time, the data is set to zero.

5. The apparatus according to claim 1, wherein the data stored in the dual port memory comprises a frequency count of occurrences of each received parameter value and the updating element comprises an adder for incrementing the stored frequency count every time the parameter value corresponding to that frequency count is received.

6. The apparatus according to claim 1, wherein each parameter value corresponds to a desired parameter of the input signal at each sampled point.

7. The apparatus according to claim 6, comprising a plurality of dual port memories each having an adder associated therewith, the memories being used to store frequency counts of occurrences of received parameter values in differing ranges of parameter values.

8. The apparatus according to claim 7, further comprising a multiplexer having an input coupled to the output of the ADC for receiving the parameter value and a plurality of outputs, each output being coupled to one of the plurality of memories, the multiplexer passing the received parameter value to one of the outputs based on the range of parameter values within which the received parameter value falls.

9. The apparatus according to claim 8, wherein the memories accept shorter bit length data words than the bit length of data words received from the ADC, and the multiplexer passes a reduced length of each parameter value data word received from the ADC to one of the plurality of outputs based on the most significant data bits that are present in the parameter value data word received from the ADC.

10. The apparatus according to claim 1, wherein the desired parameter is power.

11. The apparatus according to claim 1, wherein the input signal is a Radio Frequency (RF) signal, or the power envelop thereof.

12. A method for updating data relating to an input signal in a dual port memory at substantially a same data sampling rate as a clock frequency of the dual port memory, the method comprising:

a. sampling the input signal at sampling points to provide a parameter value corresponding to a desired parameter of the input signal at each sampled point;

b. storing data relating to each received parameter value in the dual port memory, the memory having an input for receiving each parameter value and an output for providing the stored data from an address in the memory corresponding to the received parameter value;

c. updating the stored data, a first port of the dual port memory being utilised as the output of the dual port memory on a first clock cycle of the dual port memory and a second port of the dual port memory being normally utilised as the input of the dual port memory on a second clock cycle; and d. comparing a parameter value on the first clock cycle of the dual port memory with a next received parameter value on a second clock cycle to provide a match signal if the received parameter value and the next received parameter value are the same, the match signal being utilised to enable the first port of the dual port memory to be used as the input for the second clock cycle so that the data updated on the first clock cycle is provided at the first port rather than the second port and is therefore correctly provided at the output of the dual port memory on the second clock cycle.

13. The method according to claim 12, wherein a single bank of the dual port memory is utilised for a first predetermined period of time for storing the updated data and is utilised for a second predetermined period of time for reading the updated data stored therein in said previous first predetermined period.

14. The method according to claim 13, further comprising storing the updated data read from the dual port memory during the second predetermined period of time into a further memory.

15. The method according to claim 14, wherein when data is read from the dual port memory during the second predetermined period of time, the data is set to zero.

16. The method according to claim 12, wherein the data stored in the dual port memory comprises a frequency count of occurrences of each received parameter value and the stored frequency count is incremented every time the parameter value corresponding to that frequency count is received.

17. The method according to claim 12, wherein the desired parameter is power.

18. The method according to claim 12, wherein the input signal is a Radio Frequency (RF) signal, or the power envelop thereof.

* * * * *